United States Patent
Deal et al.

(10) Patent No.: US 6,353,915 B1
(45) Date of Patent: Mar. 5, 2002

(54) METHODS FOR EVALUATING SYSTEMS OF ELECTRONIC COMPONENTS

(75) Inventors: Gregory K. Deal, West Chester; Mark W. Jennion, Chester Springs; Oleg Rodionov, Philadelphia, all of PA (US)

(73) Assignee: Unisys Corporation, Blue Bell, PA (US)

(*) Notice: Subject to any disclaimer, the term of this patent is extended or adjusted under 35 U.S.C. 154(b) by 0 days.

(21) Appl. No.: 09/285,031

(22) Filed: Apr. 1, 1999

(51) Int. Cl.[7] .............................................. G06F 17/50
(52) U.S. Cl. ........................................................ 716/4
(58) Field of Search .............................. 716/4; 364/489, 364/488; 395/500.49

(56) References Cited

U.S. PATENT DOCUMENTS

| | | | |
|---|---|---|---|
| 5,025,402 A | 6/1991 | Winkelstein | 364/578 |
| 5,051,938 A | 9/1991 | Hyduke | 364/578 |
| 5,297,053 A | 3/1994 | Pease et al. | 364/474.24 |
| 5,297,066 A | 3/1994 | Mayes | 364/578 |
| 5,400,270 A | 3/1995 | Fukui et al. | 364/578 |
| 5,539,652 A | 7/1996 | Tegethoff | 364/490 |
| 5,590,049 A | 12/1996 | Arora | 364/489 |
| 5,870,308 A | * 2/1999 | Dangelo et al. | 364/489 |
| 5,910,897 A | * 6/1999 | Dangelo et al. | 364/488 |
| 5,933,356 A | * 8/1999 | Rostoker et al. | 364/489 |
| 5,960,191 A | * 9/1999 | Sample et al. | 395/500.49 |

OTHER PUBLICATIONS

William D. Billowitch, "Board–Level Simulation Using Models with X–State Handling," VLSI Systems Design, Feb. 1987, pp 56–60.

Puri, et al., "How To Use A General Purpose Tester As A Custom VLSI Design Tool," IEEE Test Conference, Paper 16.1, IBM Corporation, 1980, pp 421–425.

* cited by examiner

*Primary Examiner*—David Nelms
*Assistant Examiner*—Thong Le
(74) *Attorney, Agent, or Firm*—Woodcock Washburn Kurtz Mackiewicz & Norris LLP; Mark T. Starr; Lise A. Rode

(57) ABSTRACT

A method for evaluating a system of interconnected electronic components is disclosed. According to the method, a library element model is generated for each electronic component in the system, in a format that can be input into an ASIC evaluation tool. A system netlist that represents the electronic components and the interconnections between them is generated, also in a format that can be input into an ASIC evaluation tool. The library element models and the system netlist are input into the ASIC evaluation tool, which is used to evaluate the system.

18 Claims, 5 Drawing Sheets

METHODS FOR EVALUATING SYSTEMS OF ELECTRONIC COMPONENTS

BACKGROUND OF THE INVENTION

This invention relates to methods for evaluating electronic components. More particularly, the invention relates to methods for evaluating systems of electronic components such as circuit board assemblies, backplanes, etc., using an application specific integrated circuit (ASIC) evaluation tool.

Semi-custom integrated circuit devices known generally as ASICs have become popular with electronic system designers. These devices are highly complicated integrated circuits that allow some degree of customization of the circuitry contained therein. Using one or more ASICs specially designed for an application, a system designer can dramatically reduce the number of electronic components (i.e., integrated circuit devices and other electronic parts) required to build an electronic system.

ASICs are available in a number of different technologies and in a variety of forms. Two primary forms of ASIC are widely available: gate-arrays and standard cell ASICs. Gate-arrays are basically an array of pre-integrated transistors ("sea of gates") and input/output pads (I/O pads) on an integrated circuit chip without interconnecting conductors. The ASIC manufacturer supplies the ASIC user with a set of standard circuits blocks (typically gates, flip-flops, multiplexers, decoders, counters, shift-registers, etc.) which may be constructed from these transistors and I/O pads and which the user employs to specify the circuitry to be contained on the ASIC in the form of a circuit diagram. Only those circuit blocks which may be readily built from "standard" transistors in the array can be offered. These circuit blocks represent the interconnections required between a set of transistors and/or I/O pad required to construct the circuit which will perform their respective functions. The interconnection of these transistors and I/O pads is accomplished by the ASIC manufacturer according to the user's circuit diagrams. After interconnecting conductors have been applied to the ASIC, the ASIC is packaged, tested, and shipped to the user.

Standard-cell ASICs are similar to gate-arrays, from the user's point of view, except that a wider variety of circuit blocks is available. The user employs a set of standard pre-defined circuit blocks to specify the circuity to be incorporated into a standard-cell ASIC in the form of the circuit diagram. In the case of standard-cell ASICs, however, no pre-integrated structures typically exist. The pre-defined circuit blocks used by the user to at define his circuitry represent complete circuit modules to be integrated onto a integrated circuit chip. Since "standard" transistors are not a limiting factor, as they are for gate-arrays, circuit geometries may be optimized for each circuit module represented by a circuit block, allowing a much wider variety of circuit blocks to be offered to the user. These circuit blocks are arranged onto a "blank" integrated circuit chip in "cookie cutter" fashion by the ASIC manufacturer according to the circuit diagram supplied by the ASIC user. As with gate-arrays, after the standard cell integration process is completed, the chips are packaged, tested and shipped to the user.

In a variation on the standard-cell theme, many ASIC manufacturers offer "core-cells," typically very large and complicated circuits (e.g., microprocessors, peripheral controllers, etc.) which may be incorporated into an ASIC design as yet another circuit block, albeit a very large one. These core-cells are typically used in conjunction with other "surrounding logic" on an ASIC to perform an application-specific function. ASICs incorporating a core-cell and surrounding logic are called "core-cell-based ASICs."

Some very large gate-based circuit blocks similar to core cells are offered for gate-arrays, as well. While core-cells for gate arrays do not generally offer the same range of function, they can be extremely complicated gate-based designs. Gate-arrays making use of such core-cell type functions are also termed "core-cell-based ASICs."

After the ASIC has been designed and manufactured, the chip must be tested for any manufacturing defects. This involves first simulating the ASIC using a variety of input test patterns, and recording the simulation output results which represent the expected outputs of a properly functioning ASIC. The input test patterns are then applied to the actual ASIC. The actual outputs are compared to the expected outputs. Deviations from the expected outputs indicate that the ASIC has a manufacturing defect.

Tools for evaluating application specific integrated circuits (ASICs) are well known. For example, "DESIGN COMPILER" is an ASIC tool commonly used for synthesizing and evaluating the logic and timing of an ASIC, such as by calculating the delay along all paths through the ASIC. Similarly, for ASIC designs that have already been verified through simulation, verification of changes can be accomplished using formal verification tools such as "FORMALITY." Currently available ASIC tools, such as "DESIGN COMPILER" and "FORMALITY" are adequate for evaluating ASICs, but not for evaluating higher level systems such as circuit board assemblies, or backplanes. "DESIGN COMPILER" and "FORMALITY" are trademarks of Synopsys, Inc., of Mountain View, Calif.

Board delay calculations, for example, typically involve adding the delay within or through board elements (e.g., ASICs, buffers, RAMs, connectors, etc.) to the delay of connections between those elements (e.g., board routing, backplane routing). Board or backplane timing analysis usually requires a tool other than an ASIC tool. This involves acquisition time and cost, installation, training, experimentation, and verification of results. Hence, board/backplane timing analysis is often done manually, with paper and pencil, calculators, or a spreadsheet. For the same reasons, the paths that are actually analyzed are only a small subset of all the paths that exist. This subset is usually selected in an attempt to analyze the worst paths. This is not a safe, reliable, comprehensive method to employ.

Board designs based in well known hardware description languages (HDLs), such as Verilog or VHDL for example, are becoming more common place as rapid go-to-market strategies demand portability and ease of re-use. As with ASICs, a bug-free design is dependent on the synthesis tool and the quality of an Engineering Change Order (ECO) process. Synthesis tools are well proven for ASIC evaluation, but not for the evaluation of boards, backplanes, or other higher level systems of electronic components. Moreover, the ECO process is somewhat manual and therefore flawed by design. Again, boards are similar to ASICs in that much effort and time go into logic placement and timed route. After this point an ECO is nearly always verified in VHDL and then implemented via a manual edit of the board netlist. Quite often this edit process creates a result that is not logically equivalent to that verified in VHDL.

Typically, ASIC designers use sophisticated synthesis, logic verification, and timing tools throughout the ASIC design process. Ever increasing sophistication of modern board/backplane designs, however, brings the need for tools of similar abilities to those used for ASIC timing and verification. Board/backplane timing analysis tools are less sophisticated and board logic verification tools are nonexistent. Thus, there is a need in the art for a method that provides reliable, efficient synthesis, logic verification, and timing analyses for boards, backplanes, and other high level systems of interconnected electronic components.

SUMMARY OF THE INVENTION

The present invention satisfies these needs in the art by providing methods for evaluating a system of electronic components. According to the present invention, an ASIC evaluation tool is used to evaluate systems of electronic components such as circuit board assemblies, backplanes, chassis, racks, etc. To analyze a board, backplane or other higher level system of electronic components, the designer uses information learned from the ASIC evaluation and combines this information with additional data corresponding to the other components that form the system. The combined data is formatted into a format the ASIC evaluation tool understands. In this way, the ASIC evaluation tool is "tricked" into believing that it is evaluating an ASIC when, in reality, it is evaluating a system of electronic components, such as a board or backplane.

According to the methods of the present invention, a designer generates a model library that includes a library element model for each electronic component in the system. The library element models are formatted to be input to an ASIC evaluation tool of the kind described above. The ASIC evaluation tool can be a timing analysis tool, a delay calculation tool, a formal verification tool, or the like, depending on the evaluation the designer wishes to perform. The library element models can be formatted in Verilog or VHDL, for example, or in any other format, depending on the ASIC evaluation tool being used.

The designer then generates a system netlist that represents the system of electronic components, along with the interconnections between the electronic components that form the system. The model library and system netlist are input into the ASIC evaluation tool to evaluate the system. Because the inputs are formatted in a format the ASIC evaluation tool recognizes, the ASIC evaluation tool sees the inputs as it would see the inputs for an ASIC. In this way, the designer practicing a method according to the present invention "tricks" the ASIC evaluation tool into believing that it is evaluating an ASIC, when it is, in reality, evaluating a higher level system such as a circuit board assembly, or backplane, etc.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, it being understood, however, that the invention is not limited to the specific methods disclosed. In the drawings.

DETAILED DESCRIPTION OF PREFERRED EMBODIMENT

ASIC Evaluation

The design process of ASICs and higher level electronic systems follow similar tracks from concept to reality, typically beginning with a high-level design of the electronic system and its major components. These high-level designs may be modeled in various high-level hardware description languages (HDLs), such as Verilog or VHDL for example, which allow partial design and verification of the overall behavior of the electronic system and/or its components. The ultimate goal is to implement the electronic system and its components in physical reality. Between these two extremes, concept and implementation, various incarnations of the design are realized.

Depending on the software tools used by the customer, the customer may either work with these modules as individual building blocks using schematic capture techniques, or the customer may specify the circuit using a hardware description language. In the latter case, a synthesis tool receives the HDL input, and synthesizes a netlist that will implement the functionality specified by the customer.

Figure 1:
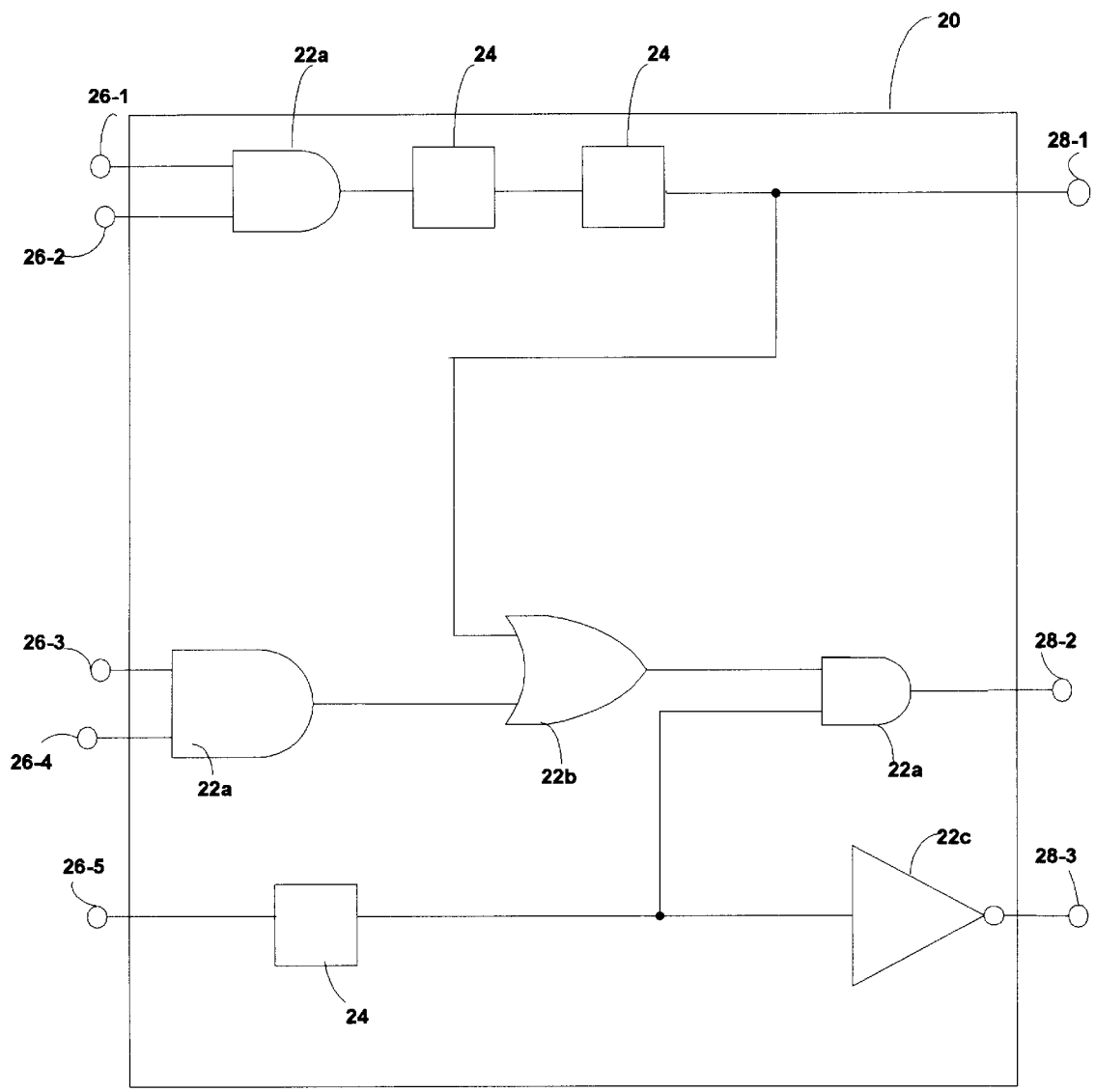
FIG. 1 is a logic diagram of an exemplary application specific integrated circuit (ASIC)

FIG. 1 shows a logic diagram of an exemplary ASIC 20. Although, in practice, a typical ASIC can include hundreds of logic paths, the number of paths shown in the ASIC depicted in FIG. 1 is limited for purposes of clarity. As shown in FIG. 1, ASIC 20 includes a number of gates 22, such as AND gates 22a, OR gates 22b, and invertors 22c. ASIC 20 also includes a number of latches 24. Data is input to ASIC 20 through input pins 26, and output from ASIC 20 through output pins 28.

To evaluate ASIC 20, a user typically creates a "netlist" modeling the ASIC 20. Those skilled in the art will appreciate that, generally speaking, a netlist comprises a list of physical circuit components, along with the interconnections between those components. Thus, a netlist defines the interconnections between all functional elements in a physical circuit. By simulating the operation of the physical circuit represented by the netlist, the proper operation of the entire physical circuit can be verified prior to fabrication.

Within ASICs, internal delays are calculated using signal transition times, intrinsic gate delay, output loading, and RC delay (e.g., for chip internal interconnect). An ASIC evaluation tool such as "DESIGN COMPILER" is used to perform internal timing analysis on the ASIC 20. Inputs to the ASIC evaluation tool for normal ASIC use include a behavioral description of the logic, and a library of timing and other information about the elements in which the design can be implemented. Its use for placed and routed ASICs includes annotating a netlist with loading and delay information with which timing analysis is performed.

To calculate the delay through the logic paths shown in ASIC 20, the user first makes a netlist comprising a library element model for every component included within the ASIC 20, along with the interconnections between those components. A library element model for a typical AND gate 22a can be, for example, cell(GA5B) {
  pin("A") {
    direction: input;

```
}
pin("B") {
   direction: input;
}
pin("O") {
   direction: output;
   timings {
      related_pin: A;
      intrinsic_rise: 6.3;
      intrinsic_fall: 6.3;
   }
   timing( ) {
      related_pin: B;
      intrinsic_rise: 6.3;
      intrinsic_fall: 6.3;
   }
 }
}
```

The netlist is used as input to the ASIC internal timing analysis tool, which will then calculate, based on the input netlist, the delay through every path through the ASIC 20. The designer can then determine from the calculated delay whether the current design will work as expected.

Similarly, if the design of an ASIC is modified after it has been verified through simulation, the designer might wish to verify that the modification will affect only that which the designer intended to affect. To perform such an evaluation, a designer would use an ASIC verification tool such as "FORMALITY." Also, ASIC verification tools can also be used to discover problems with a design that may not have been detected during simulation.

Typically, each element included in the ASIC 20 will have been synthesized using a synthesis tool such as "DESIGN COMPILER." The synthesis tool makes use of not only the ASIC logic, but also of the timing and delay calculation. To make the formal verification process more efficient, the formal verification tool synthesizes the affected components without considering timing effects. The result of this "shadow" synthesis is a netlist such as described above.

The formal verification tool can then be used to compare the netlist (typically in EDIF) with a behavioral description of the ASIC design (typically in HDL). The formal verification tool will determine whether the netlist and the behavioral description are logical equivalents. In some cases, the designer purposefully will have made logical changes to the ASIC design during the process of generating the netlist. In these cases, the designer would expect the ASIC verification tool to show that logical differences exist between the netlist for the modified ASIC and the behavioral description of the unmodified ASIC. Typically, the designer wants to maintain consistency between the behavioral description and the netlist and, therefore, modifies the behavioral description to reflect these changes before the ASIC verification tool is run.

For example, consider a path through an AND gate. The logical expression for that path might be A=B*C. From this logical expression, a synthesis tool might generate a result such as AND gate
   1=B
   2=C
   3=A Suppose next that the designer wants to modify the ASIC design by changing the AND gate to an OR gate. The logical expression now becomes, for example, A=B+C. If the designer were to input the netlist for the modified ASIC into a synthesis tool, the designer would expect the result to be, for example, OR gate
   1=B
   2=C
   3=A To avoid having to do a complete re-synthesis including timing, the formal verification tool synthesizes the new logic of the modified ASIC, without considering timing. The output of this shadow synthesis is compared against the output of the complete synthesis performed on the unmodified ASIC. In the example shown above, the two results would be compared and the only difference would be that the AND gate is now an OR gate as the designer would expect. Typically, formal verification tools can be used to compare VHDL to EDIF, as well as EDIF to EDIF. EDIF (Electronic Data Interchange Format) is an industry standard format for hardware design language information.

On the other hand, in a situation where there are hundreds of logic paths through the ASIC, it is conceivable that a change to one component on a logic path (e.g., changing an AND gate to an OR gate) might create a modified ASIC that is not logically equivalent to the unmodified ASIC. Sometimes, this is exactly what the designer expects, but at other times the designer might expect the modified ASIC to be the logical equivalent of the unmodified ASIC. For example, the designer might be trying to optimize the performance of the ASIC by changing certain components or connections. In such an example, the designer most likely wants the modified ASIC design to be the logical equivalent of the unmodified design. Formal verification tools such as "FORMALITY" can be used to determine whether the modified ASIC design is logically equivalent to the unmodified design.

Methods for Evaluating Systems of Electronic Components

According to the present invention, ASIC evaluation tools, such as those described above, are used to evaluate systems of electronic components such as circuit board assemblies, backplanes, chassis, racks, etc. To analyze a board or backplane or other higher level system of electronic components, the designer uses information learned from the ASIC evaluation together with additional information corresponding to the other components that form the system as input into the ASIC tool. The inputs are formatted into a format the ASIC evaluation tool understands. In this way, the ASIC evaluation tool is "tricked" into believing that it is evaluating an ASIC when, in reality, it is evaluating a system of electronic components, such as a board or backplane.

Figure 2:
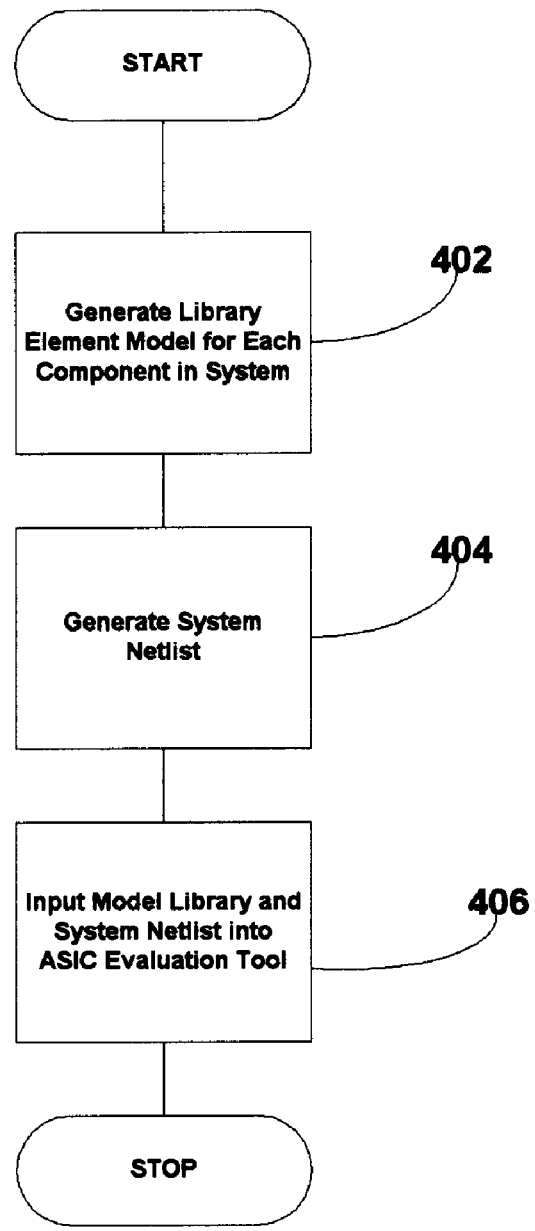
FIG. 2 is a flowchart of a method for evaluating systems of electronic components in accordance with the present invention.

FIG. 2 is a flowchart of the steps of a method 400 for evaluating a system of interconnected electronic components according to the present invention. At step 402, the designer generates a model library that includes a library element model for each electronic component in the system. The library element models are formatted to be input to an ASIC evaluation tool of the kind described above. The ASIC evaluation tool can be a timing analysis tool, a delay calculation tool, a formal verification tool, or the like, depending on the evaluation the designer wishes to perform. The library element models can be formatted in VHDL, for example, or in any other format, depending on the ASIC evaluation tool being used.

At step 404, the designer generates a system netlist that represents the system of electronic components, along with the interconnections between the electronic components that form the system. The system netlist is also generated in a format the ASIC evaluation tool can understand.

At step 406, the model library and system netlist are input into the ASIC evaluation tool. Because the model library and system netlist are formatted in a format the ASIC evaluation tool recognizes, the ASIC evaluation tool sees the inputs as it would see the model library and netlist for an ASIC. At this point, the ASIC evaluation tool simply performs its analysis unaware that it is analyzing a system of electronic components, rather than an ASIC. Thus, the designer practicing a method according to the present invention "tricks" the ASIC evaluation tool into believing that it is evaluating an ASIC, when it is, in reality, evaluating a higher level system such as a circuit board assembly, or backplane, etc.

Timing Analysis of Circuit Board Assembly

For exemplary purposes, the method of the present invention will be discussed in conjunction with the evaluation of a circuit board assembly, although those skilled in the art will appreciate that the same methods can be applied to backplane analysis, chassis analysis, rack analysis, or to the analysis of any other higher level system of electronic components.

Figure 3:
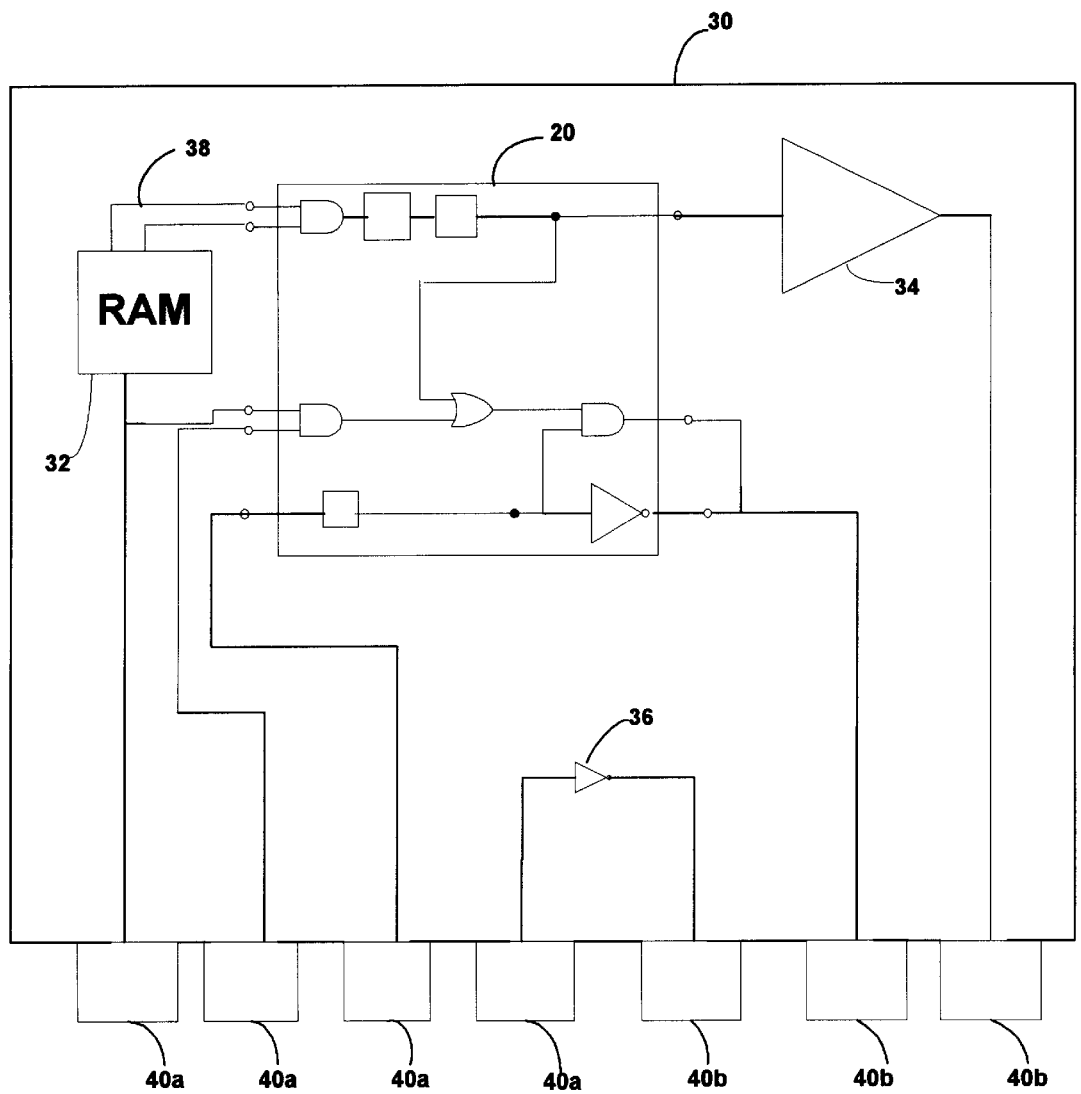
FIG. 3 is a logic diagram of an exemplary circuit board assembly.

FIG. 3 shows a logic diagram of an exemplary system of interconnected electronic components, such as a circuit board assembly, that might be evaluated using method 400 described above. As shown in FIG. 3, circuit board assembly 30 includes the following electronic components: an ASIC 20 (such as described above in connection with FIG. 1), a random access memory (RAM) 32, a delay element 34, and an inverter 36. The electronic components are interconnected via conductors 38. Circuit board assembly 30 also has a plurality of pins 40 for seating circuit bard assembly 30 into a chassis, for example (not shown). Data is input into circuit board assembly 30 via input pins 40*a*, and output from circuit board assembly 30 via output pins 40*b*.

Figure 4:
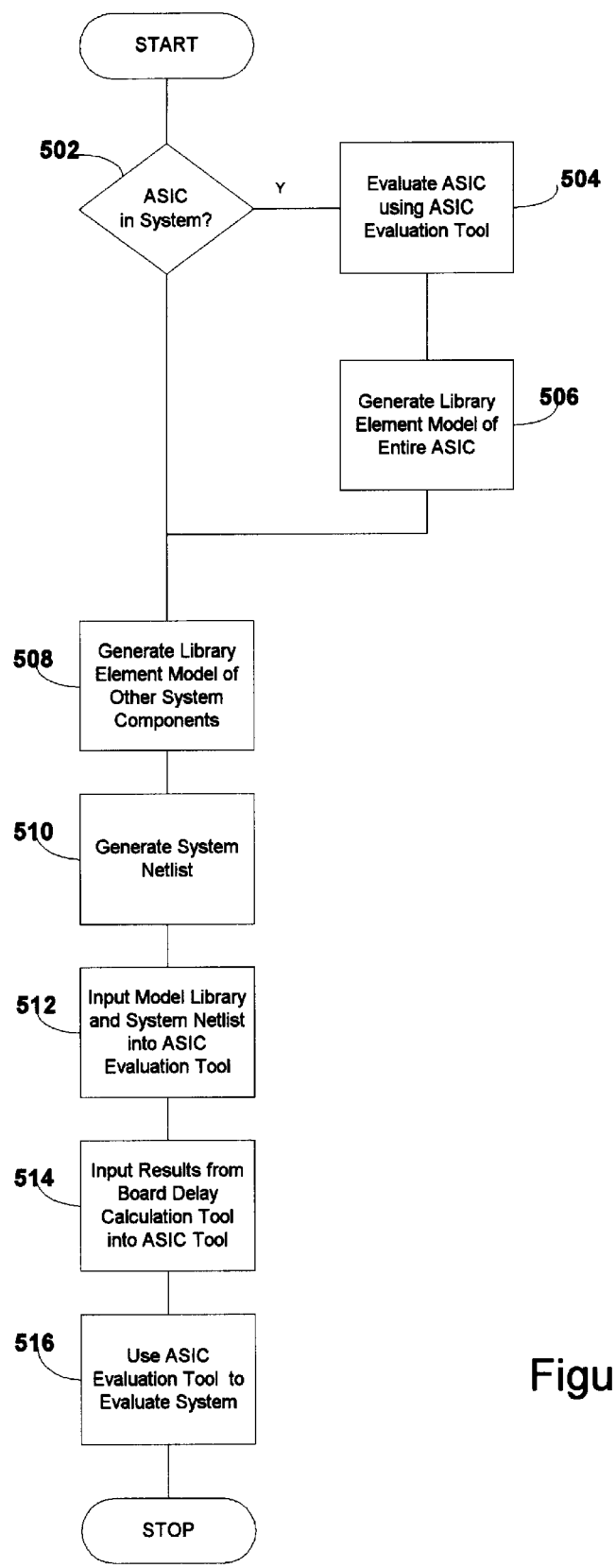
FIG. 4 is a flowchart of a preferred embodiment of a method according to the present invention for performing timing analysis on a circuit board assembly.

FIG. 4 provides a flowchart of a preferred embodiment of a method according to the present invention for evaluating a circuit board assembly such as circuit board assembly 30 shown in FIG. 3. According to the inventive method 500, the designer first determines, at step 502, whether there is an ASIC in the system. If there is, at step 504 the designer evaluates the ASIC 20 using an ASIC evaluation tool. For example, if the designer is performing a delay calculation on the board 30, the designer first performs a delay calculation on the ASIC 20. As described above, the ASIC evaluation tools for calculating delay through the ASIC will calculate the delay for all the paths through the ASIC 20.

At step 506, the designer uses the output of the ASIC evaluation tool to generate a library element model of the entire ASIC. That is, the designer generates a library element that models the ASIC as a single component of the system, rather than as a plurality of components itself.

Logic buried deep within the ASIC may require an enormous number of test patterns to test. Cores, for example, may range in size up to extremely large functional blocks such as a reduced instruction set computer (RISC) processor. To avoid having to retest all the logic paths through the ASIC, the ASIC designer typically creates a "timing shell," which contains the input/output timing specifications of the core, and a "synthesis shell," which is a high level description of the implementation of the core, containing enough information for optimization to the synthesis tool regarding the core.

To construct the library element model for the entire ASIC, timing analyses are performed from all input pins to state elements (e.g., gates, latches, etc.), from all state elements to output pins, and from inputs to outputs if they exist. This is turned into a model with setup, hold, output propagation, and through propagation timing arcs. For example, in reference to ASIC 20 shown in FIG. 1, timing analysis is performed for the paths from input pin 26-1 to AND gate 22*a*, from input pin 26-2 to AND gate 22*a*, from input pin 26-5 to latch 24, etc. Similarly, timing analysis is performed from latch 24 to output pin 28-1, from invertor 22*c* to output pin 28-3, etc. In this way, the system level model of the ASIC (i.e., the model of the ASIC as a single component of the system) is a "shell."

By ignoring the internal logic of the ASIC during board level evaluation, the total number of paths through the circuit board assembly that must be evaluated is greatly reduced. In this way, a complete path analysis through the board can be conducted. The processing effort required to consider all the paths through the ASIC in the board level evaluation would be prohibitive.

At step 508, the designer generates a library element model for each of the other board components in the form of a typical library element model used in ASIC evaluation. In a preferred embodiment, for each component, a cell name is declared, and all pins are declared, each pin being declared with a direction. Timing is added for any timing arcs that are needed. Preferably, pin names match the board EDIF's view of the element.

Actual VHDL of the board components can be linked to the board or backplane VHDL. In some applications, it may be useful to replace the actual components by "shells" (i.e., the description of pins of the components with no logic defined). Existing ASIC evaluation tools allow marking such components as "black boxes." This feature is useful for the sake of saving time when only a top-level board or backplane needs to be verified. It also provides flexibility when the ASICs or other components are still in the design stage.

For simple elements, timing is basically input pin to output pin. For example, the library element model for a typical delay 34 might be:

```
cell(DLYX) {
    pin(DLYOUT) {
        direction: output;
        timing( ) {
            related_pin: DLYIN;
            intrinsic_rise: 0.5;
            intrinsic_fall: 0.5;
        {
    {
    pin(DLYIN) {
        direction: input;
    {
{
```

A more complex example is a RAM 32. For example, the library element model for part of a 16k×18 RAM might be:

```
cell (DHTZ) {
    pin (A[0]) {
        direction: input;
        timing) {
            related_pin: K;
            timing_type: setup_rising;
            intrinsic_rise: 2;
            intrinsic_fall: 2;
        timing( ) {
            related_pin: K;
            timing_type: hold_rising;
            intrinsic_rise: 1;
            intrinsic_fall: 1;
        {
    {
    pin(D[0]) {
        direction: input;
        timing( ) {
            related_pin: K;
            timing_type: setup_rising;
```

```
            intrinsic_rise: 2;
            intrinsic_fall: 2;
         }
      }
      pin(Q[0]) {
         direction: output;
         timing( ) {
            related_pin: K;
            timing_type: rising_edge;
            intrinsic_rise: 6;
            intrinsic_fall: 6;
         }
      }
      pin(K) {
         direction: input;
      }
   }
```

Preferably, the delay description matches the EDIF's view in terms of the number of pins. The timing model, however, can have more pins than the real element. This might be useful to allow easy clock pin identification and the creation of a clock specification.

At step 510, the user generates a system netlist, that represents the electronic components that form the system, along with the interconnections between them. In this example, the designer would generate a board level netlist that represents the circuit board assembly 30 shown in FIG. 1. It is anticipated that, in some cases, system netlists will exist in a format that is unacceptable for input to the ASIC evaluation tool. In those cases, an automated conversion routine can be used to convert the system netlists into a format acceptable to (i.e., can be understood by) the ASIC evaluation tool.

At step 512, the designer provides as input for the ASIC evaluation tool the model library for the system and the system netlist, rather than the model library for the ASIC and the ASIC netlist.

At step 514, the designer calculates the delay along the conductors 38 on the circuit board assembly 30 using atypical board delay calculation tool. The designer can then use the results generated by the board delay calculation tool as input to the ASIC evaluation tool.

At step 516, the designer simply runs the ASIC evaluation tool and the results its generates provide, not an evaluation of an ASIC, but an evaluation of the entire system of electronic components. Because the inputs are formatted into a format acceptable to the ASIC evaluation tool, the tool is unaware that the inputs represent a system of electronic components, rather than merely and ASIC.

Backplane analysis can be performed essentially the same way as board analysis. A backplane netlist is used with board models to perform the timing analysis in an analogous fashion. For example, a backplane netlist can be created to represent a connection of boards, with each board represented by a location and pin location. The main parts of the EDIF to be constructed are a "cell" for each board type, an "instance" of a board in each location, and the "nets" that join multiple occurrences of instance and port (i.e., connections to a cell). Thus, inputs to the ASIC evaluation tool are created wherein the elements are boards with timing information from and to all connector pins in the board environment.

Formal Verification of Circuit Board Assembly

ASIC verification tools allow for the input of the synthesizable VHDL as the reference point for verification. Board VHDL might need to be manipulated due to shortcuts taken by the board designers that might produce failures during verification. Such shortcuts include, but are not limited to, the direction of the pins. Designers typically use the bi-directional definition, while the actual direction might be strictly input or output.

Figure 5:
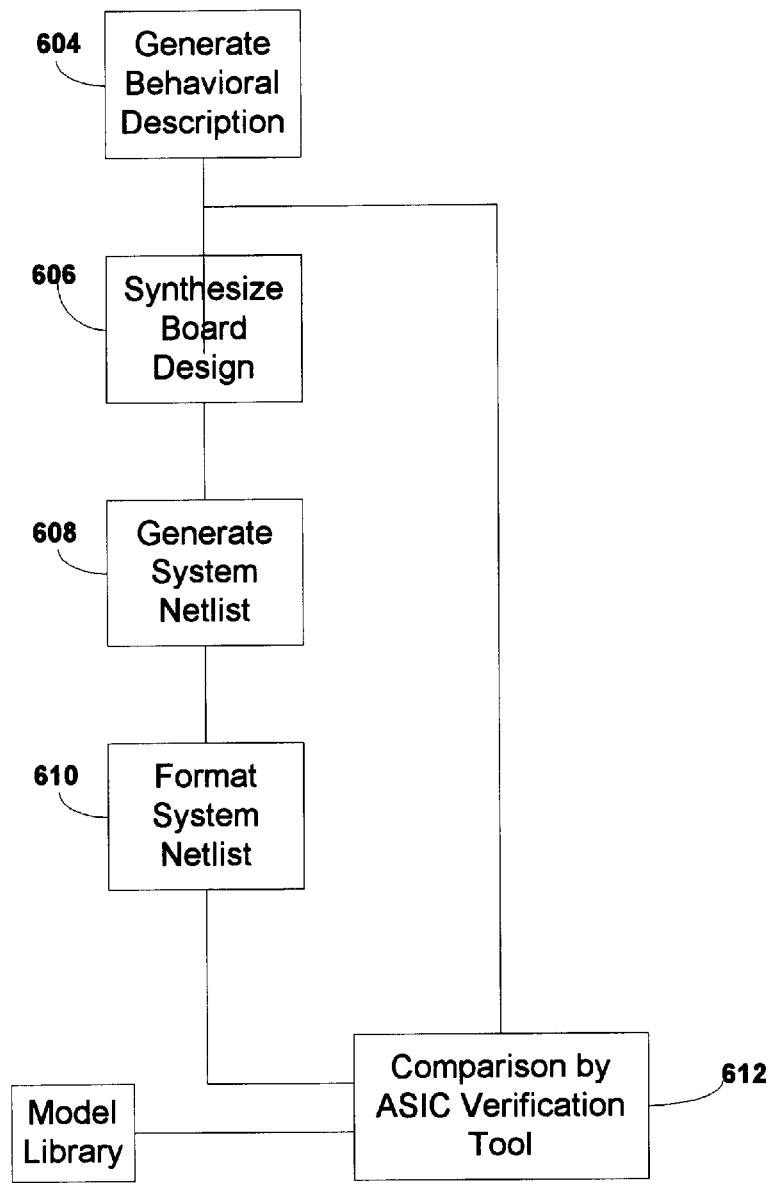
FIG. 5 is a flowchart of a preferred embodiment of a method according to the present invention for performing formal verification of a circuit board assembly.

FIG. 5 provides a flowchart of a preferred embodiment of a method 600 for performing formal verification of a circuit board assembly such as circuit board assembly 30 shown in FIG. 3. At step 604, the designer simulates the design of the circuit board assembly by generating a behavioral description of the board design, preferably in a hardware description language such as VHDL or Verilog, for example.

At step 606, the designer synthesizes the board design using a known synthesis tool. The synthesis tool generates a logic model of the circuit board assembly that includes models of the electronic components and interconnections between them. At this point, the electronic components are routed generically, i.e., they are not yet physically placed.

At step 608, the designer generates a system netlist that represents the electronic components that form the system, along with the interconnections between them. To generate the system netlist, the designer preferably "places" the electronic components onto a circuit board model. More specifically, the designer simulates the circuit board assembly as an x-y grid and identifies the grid coordinates for at least some of the electronic components. The grid coordinates represent the location on the actual circuit board assembly at which the components will be located. Similarly, the designer models the actual routing between components by placing the interconnections on the grid.

Throughout the process of generating the system netlist, numerous occasions arise wherein the designer elects to modify the board design. For example, although programs exist that aid in the process of generating the system netlist, the process is almost completely manual. Moreover, it is commonly the case where many designers contribute to a board's design. Consequently, the process of generating the system netlist is prone to human error. Moreover, as the board design matures, the designers might uncover earlier design flaws and want to alter the design to correct. In most cases, the designers will want to optimize the board design once the components have been physically placed to reduce board size, improve performance, etc. For any of these reasons, the designers need to be sure that the system netlist generated at step 608 is the logical equivalent to the behavioral description geneated at step 604.

According to the present invention, an ASIC verification tool, such as "FORMALITY," can be used as a mechanism for the designers to compare the behavioral description with the system netlist. To accomplish this, the designer formats the system netlist, at step 610, into a format the ASIC verification tool can understand. Preferably, the system netlist is provided in Electronic Data Interchange Format EDIF).

At step 612, the behavioral description and the system netlist are input into the ASIC verification tool, along with the model library that includes the library element models for the electronic components that form the system. During this step, connections between the board and the components are verified. Problems such as using the wrong components, improper connections, or incorrect direction of the pins are identified. The ASIC verification tool compares the system netlist with the behavioral description to verify that the two are logically equivalent. If they are, the designer has the confidence needed to send to release the design for build.

In some situations, the designers will have made logical changes to the board design during the generation of the system netlist at step 608. In these situations, the designer will typically change the behavioral description by hand to match the modified board design. This process is prone to human error and changes to one part of the board design might cause unexpected problems with another part of the board design. For these reasons, as well, the designer might want verify that the modified behavioral description and the modified system netlist are logical equivalents.

It should be noted that, although the above described method illustrates a preferred embodiment in which an ASIC verification tool was used to compare a behavioral description in an HDL with a system netlist in EDIF, the present invention is in no way so limited. For example, the ASIC verification tool can be used to compare HDL to EDIF, HDL to HDL, or EDIF to EDIF, depending on the specific needs of the designers.

The use of an ASIC tool to perform board/backplane analyses provides numerous advantages in terms of cost and efficiency. By practicing the methods of the present invention, the user can avoid the time and expense of using a different tool for board level testing and verification. In most cases, the user will have already purchased, installed, tested, and reliably run such a tool for ASIC analysis. Many users are trained in its use, and typically use the tools frequently and effectively. Moreover, the results these tools generate are predictable.

Timing analysis tools, for example, are fast and trace and analyze all paths existing in a design. As discussed in detail above, with appropriate modeling techniques and some file/data manipulation, the ASIC evaluation tool can be used to do complete board/backplane timing. Logical verification tools are thorough and complete (i.e., they compare all VHDL logic to all logic contained in the netlist). These tools are even capable of analyzing through connectors and therefore verifying sub-systems or whole systems. With appropriate modeling techniques and some file/data manipulation, the tool can be used to do complete logical equivalency checks between the desired VHDL and the manually edited netlist.

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

We claim:

1. A method for evaluating a system of interconnected electronic components, the method comprising the steps of:
    generating a model of a system including a plurality of interconnected electronic components in a format that can be input into an ASIC evaluation tool; and
    using the ASIC evaluation tool to evaluate the system by providing the model as input for ASIC evaluation tool.

2. The method of claim 1, wherein the system of interconnected components comprises a circuit board assembly.

3. The method of claim 1, wherein the system of electronic components comprises a backplane.

4. The method of claim 1, wherein the model is in a hardware description language (HDL).

5. The method of claim 1, wherein the model is in electronic data interchange format (EDIF).

6. The method of claim 1, wherein the ASIC evaluation tool is a timing analysis tool.

7. The method of claim 1, wherein the ASIC evaluation tool is a logical verification tool.

8. A method for evaluating a system of interconnected electronic components, the method comprising the steps of:
    generating a library element model for each electronic component in a system including a plurality of interconnected electronic components, wherein each library element model is formatted to be input to an ASIC evaluation tool;
    generating a system netlist that represents the electronic components and the interconnections between the electronic components; and
    inputting the library element models and the system netlist to the ASIC evaluation tool to evaluate the system.

9. The method of claim 8, wherein each said electronic component has at least one pin, and wherein the library element model for each said electronic component includes a declaration of said at least one pin, said declaration including a flow direction.

10. The method of claim 8, wherein at least one said electronic component has internal logic, and wherein the library element model for the said at least one electronic component excludes description of at least some of the internal logic.

11. The method of claim 8, wherein the system includes at least one ASIC having internal logic and at least one pin, the method comprising the further step of:
    generating a library element model for the ASIC that includes a description of the at least one pin.

12. The method of claim 11, wherein the library element model for the ASIC excludes description of at least some of the internal logic of the ASIC.

13. A method for performing delay and timing analyses on a system of interconnected electronic components, the method comprising the steps of:
    generating a library element model for each electronic component in the system, wherein each library element model is formatted to be input to an ASIC delay calculation tool;
    generating a system netlist that represents the system of electronic components and the interconnections between the electronic components;
    inputting the library element models and the system netlist into the ASIC delay calculation tool; and
    using the ASIC delay calculation tool to calculate, based on the library element models and the system netlist, the delay the through at least one path through the electronic components.

14. A method for evaluating a system design for a system of interconnected electronic components, the method comprising:
    generating a model library comprising a library element model for each electronic component in a system including a plurality of interconnected electronic components, wherein each library element model is formatted to be input into an ASIC verification tool;
    generating a behavioral description of the system design in a format that can be input into the ASIC verification tool;

generating a system netlist that represents the system of electronic components and the interconnections between the electronic components in a format that can be input into the ASIC verification tool, inputting the model library, the behavioral description, and the system netlist into the ASIC verification tool; and using the ASIC verification tool to compare the system netlist with the behavioral description to determine whether the system netlist is logically equivalent to the behavioral description.

15. The method of claim 14, further comprising:

identifying at least one electronic component or interconnection to be modified to form a modified system;

generating, in a format that can be input into the ASIC verification tool, a modified system netlist that represents the modified system;

generating a modified behavioral description of the modified system design in a format that can be input into the ASIC verification tool;

inputting the model library, the behavioral description, and the system netlist into the ASIC verification tool; and using the ASIC verification tool to compare the system netlist with the behavioral description to determine whether the system netlist is logically equiavlent to the behavioral description.

16. The method of claim 14, wherein the behavioral description is in a hardware description language (HDL).

17. The method of claim 14, wherein the model library is in electronic data interchange format (EDIF).

18. The method of claim 14, wherein the system netlist is in electronic data interchange format (EDIF).

* * * * *